United States Patent [19]
Murai et al.

[11] Patent Number: 5,940,344
[45] Date of Patent: Aug. 17, 1999

[54] SYNCHRONOUS SEMICONDUCTOR MEMORY DEVICE INCLUDING INTERNAL CLOCK SIGNAL GENERATION CIRCUIT THAT GENERATES AN INTERNAL CLOCK SIGNAL SYNCHRONIZING IN PHASE WITH EXTERNAL CLOCK SIGNAL AT HIGH PRECISION

[75] Inventors: Yasumitsu Murai; Wataru Sakamoto; Hisashi Iwamoto, all of Hyogo, Japan

[73] Assignees: Mitsubishi Denki Kabushiki Kaisha; Mitsubishi Electric Engineering Company Limited, both of Tokyo, Japan

[21] Appl. No.: 09/053,058

[22] Filed: Apr. 1, 1998

[30] Foreign Application Priority Data

Oct. 13, 1997 [JP] Japan .................................. 9-278734

[51] Int. Cl.⁶ ..................................................... G11C 8/00

[52] U.S. Cl. ...................... 365/233; 365/194; 365/189.07

[58] Field of Search ..................................... 365/233, 194, 365/189.07, 230.08

[56] References Cited

U.S. PATENT DOCUMENTS

| | | |
|---|---|---|
| 5,252,865 | 10/1993 | Davenport et al. . |
| 5,592,109 | 1/1997 | Notani et al. . |
| 5,629,897 | 5/1997 | Iwamoto et al. ..................... 365/233 X |
| 5,740,115 | 4/1998 | Ishibashi et al. .................... 365/233 X |

FOREIGN PATENT DOCUMENTS 7-273645  10/1995  Japan .

*Primary Examiner*—Huan Hoang
*Attorney, Agent, or Firm*—McDermott, Will & Emery

[57] ABSTRACT

In an internal clock signal generation circuit, a phase comparator for detecting phase difference between an external clock signal and an internal clock signal includes a transistor and a capacitor with respect to a signal line through which a clock signal corresponding to the external clock signal is transmitted, and a transistor and a capacitor with respect to a signal line through which a clock signal corresponding to the internal clock signal is transmitted. The rising timing of the signal having a more lagging phase of the signals of the two signal lines becomes more gentle. As a result, the phase difference is increased, and the phase comparator can compare the phase at high precision.

14 Claims, 13 Drawing Sheets

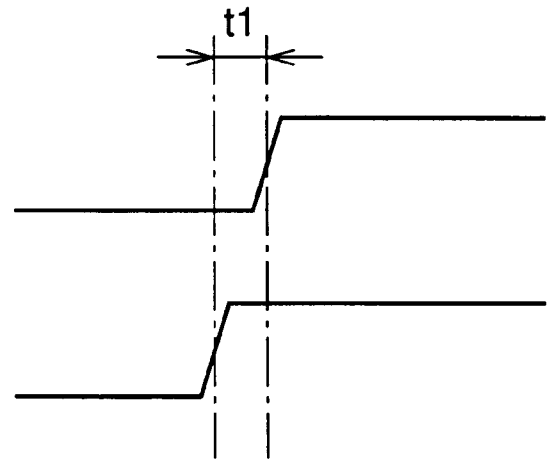
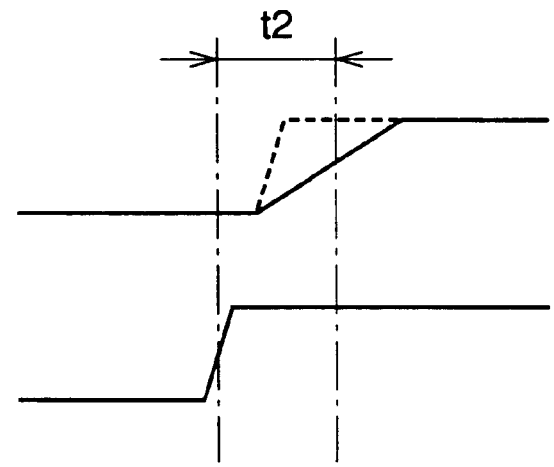

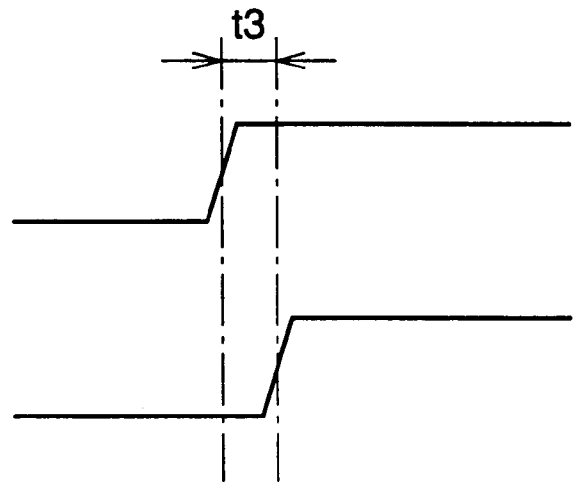
FIG.6A  ECLK
FIG.6B  RCLK
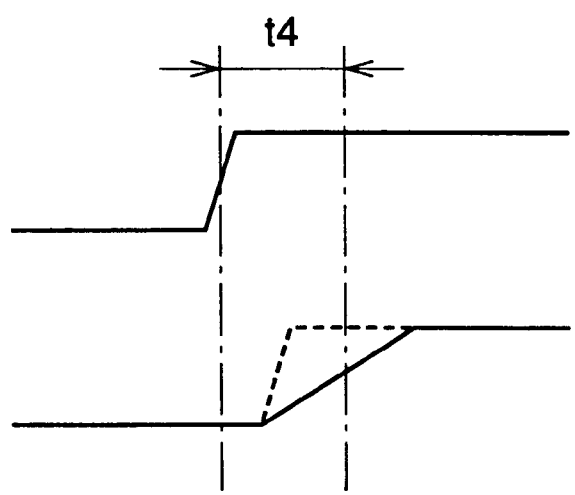
FIG.7A  ECLK
FIG.7B  RCLK

SYNCHRONOUS SEMICONDUCTOR MEMORY DEVICE INCLUDING INTERNAL CLOCK SIGNAL GENERATION CIRCUIT THAT GENERATES AN INTERNAL CLOCK SIGNAL SYNCHRONIZING IN PHASE WITH EXTERNAL CLOCK SIGNAL AT HIGH PRECISION

BACKGROUND OF THE INVENTION

1. Field of the Invention

The present invention relates to a synchronous type semiconductor memory device, and more particularly, to a synchronous semiconductor memory device that receives an external signal in synchronization with an externally applied clock signal.

2. Description of the Background Art

Although a dynamic random access memory (referred to as DRAM hereinafter) employed used as a main memory is increased in speed, the operating rate still does not yet comply with the improvement in the operating rate of a microprocessor (MPU).

The access time and cycle time of a DRAM becomes the bottleneck to prevent improvement of the entire system performance. A synchronous semiconductor memory device (referred to as SDRAM hereinafter) that operates in synchronization with an externally applied clock signal is proposed as the main memory for the recent high speed MPU.

In an SDRAM, successive access specification set forth in the following in synchronization with a system clock which is an external clock signal is proposed.

A typical operation for meeting the high speed access specification of a conventional SDRAM will be described hereinafter with reference to the timing charts of FIGS. 13A–13F.

In FIGS. 13A–13F, the writing or reading operation of data of 8 successive bits (a total of 64 bits by 8×8) in an SDRAM that allows input and output of 8-bit data (byte data) through data input/output terminals DQ0–DQ7 is shown. The number of bits of data read out continuously is called "burst length". In an SDRAM, the burst length can be modified by a mode register.

As shown in FIGS. 13A–13F, an external control signal (for example, a row address strobe signal /RAS, a column address strobe signal /CAS, an address signal Add, and the like) is received at a rising edge of an externally applied clock signal ext.CLK in an SDRAM. Address signal Add is applied having a row address signal X and a column address signal Y multiplexed in a time divisional manner. When row address strobe signal /RAS is in an active state of L (logical low) at a rising edge of external clock signal ext.CLK, the current address signal Add is received as row address signal X.

When column address strobe signal /CAS is in an active state of an L level at a rising edge of external clock signal ext.CLK, the current address signal Add is input as a column address Y. A select operation of a row and a column is carried out in an SDRAM according to the received row address signal (Xa in FIG. 13E) and column address signal (Yb in FIG. 13E).

At an elapse of a predetermined clock period (3 clock cycles in FIG. 13A) from a fall of row address strobe signal /RAS to an L level, the first 8-bit data is output.

Data is output in response to a rise of external clock signal ext.CLK thereafter.

In a writing operation, a row address signal is input in a manner similar to that of the readout operation (Xc in FIG. 13E). When column address strobe signal /CAS and write enable signal /WE both are at an L level of an active state at a rising edge of external clock signal ext.CLK, a column address signal (Yd in FIG. 13E) is input, and the currently applied data (d0 in FIG. 13F) is taken as the first write data.

In response to a fall of row address strobe signal /RAS and column address strobe signal /CAS, a row and column select operation is carried out in the SDRAM. Input data d1, . . . , d7 are sequentially received in synchronization with external clock signal ext. CLK. The input data is sequentially written into a memory cell.

In contrast to a conventional DRAM that receives an address signal, input data, and the like in synchronization with an external control signal (row address strobe signal /RAS and column address strobe signal /CAS), an external signal (row address strobe signal /RAS, column address strobe signal /CAS, address signal Add, input data, and the like) is received at a rising edge of an externally applied clock signal ext.CLK in an SDRAM.

The successive access time can be speeded if writing and reading of continuous data can be effected in synchronization with an external clock signal.

In accordance with a MPU of a higher rate, the problem of improving the speed of an internal clock signal has become in inevitable from the standpoint of the entire system performance. Therefore, an internal clock generation circuit is proposed directed to generating an internal clock signal in synchronization with a received external clock signal ext.CLK. An internal clock generation circuit is disclosed in, for example, "PHASE COMPARATOR AND PLL CIRCUIT" (Japanese Patent Laying-Open No. 7-273645), and "INTEGRATING PHASE DETECTOR" (U.S. Pat. No. 5,252,865).

A delay locked loop (referred to as DLL circuit hereinafter) which is an example of an internal clock signal generation circuit incorporated in a conventional SDRAM will be described hereinafter with reference to FIG. 14.

Referring to FIG. 14, a conventional DLL circuit 900 includes a clock buffer 2, a delay line 4, shift register 6, a delay circuit 8 and a phase comparator 14.

Clock buffer 2 receives an externally applied clock signal (referred to as external clock signal CLK0 hereinafter) and provides a clock signal ECLK. Delay line 4 delays clock signal ECLK and provides a clock signal (referred to as internal clock signal CLK1 hereinafter). Delay circuit 8 delays internal clock signal CLK1 for providing a clock signal RCLK. Phase comparator 14 compares the phases of clock signal ECLK received via a signal line A1 and clock signal RCLK received via a signal line A2 to alter the state of shift register 6 according to the comparison result. Shift register 6 responds to an output of phase comparator 14 to alter the delay time of delay line 4.

More specifically, when clock signal RCLK corresponding to internal clock signal CLK1 is behind clock signal ECLK corresponding to external clock signal CLK0, the delay time of delay line 4 is shortened. When clock signal RCLK is ahead of clock signal ECLK in phase, the delay time of delay line 4 is lengthened. As a result, an internal clock signal CLK1 in phase-synchronization with external clock signal CLK0 is output.

The structure of conventional phase comparator 14 will be described briefly hereinafter with reference to FIG. 15.

Referring to FIG. 15, phase comparator 14 includes delay circuits 90, 91, 92 and 93, inverter circuits 73, 74, 75, 76, and 77, AND circuits 79 and 80, latch circuits 81, 82, 83, 84, 85, and 86, and MOS transistors N12, N13, N14, N15, N16 and N17.

Delay circuit 90 delays the received signal of an input node Z60 and provides the delayed signal (referred to as clock signal EC hereinafter). Delay circuit 91 delays the received signal of an input node Z65 and provides the delayed signal. Delay circuit 92 delays the received signal from delay circuit 91 and provides the delayed signal. Delay circuit 93 delays the received signal of input node Z65 and provides the delayed signal.

Input node Z60 is connected to signal line A1 of FIG. 14. Input node Z65 is connected to signal line A2 of FIG. 14

Inverter circuits 73, 74, 75 and 76 are connected in series. Inverter circuit 73 receives an input clock signal EC. Inverter circuit 76 has its output node connected to a first input node of AND circuit 79 and to a first input node of AND circuit 80.

MOS transistor N12, latch circuit 81, MOS transistor N15 and latch circuit 84 are connected in series between the output node of delay circuit 92 and a second input node of AND circuit 79. MOS transistor N13, latch circuit 82, MOS transistor N16 and latch circuit 85 are connected in series between delay circuit 93 and a third input node of AND circuit 79. Inverter circuit 77 is connected between latch circuit 85 and a second input node of AND circuit 80. MOS transistor N14, latch circuit 83, MOS transistor N17 and latch circuit 86 are connected in series between input node Z65 and a third input node of AND circuit 80.

MOS transistors N12, N13 and N14 have respective gate electrodes connected to the output node of inverter circuit 73. MOS transistors N15, N16 and N17 have respective gate electrodes connected to the output node of inverter circuit 74.

Each of latch circuits 81, 82, 83, 84, 85 and 86 includes inverter circuits 95 and 96.

Here, the signal applied to the second input node of AND circuit 79 is referred to as signal C. The signal applied to inverter circuit 77 is referred to as signal B. The signal applied to the third input node of AND circuit 80 is referred to as signal A.

In phase comparator 14 shown in FIG. 15, signals A, B and C are altered according to the phase difference between the signal received at input node Z60 and the signal received at input node Z65 at the trigger of clock signal EC.

More specifically, when the signal received at input node Z60 is ahead of the signal received at input node Z65, signal A attains an H level, and signals B and C attain an L level. As a result, a DOWN signal of an H level is output from AND circuit 79.

When the signal received at input node Z65 is behind the signal received at input node Z60, signals A, B and C all attain an H level, whereby an UP signal of an H level is output from AND circuit 80.

The phases between an external clock signal and a generated internal clock signal must be compared in order to generate an internal clock signal that is in phase-synchronization with an external clock signal.

However, the conventional phase comparator had the problem that the phase comparison precision is limited due to the switching time of the transistor which is a constitutional element, the inversion time of the latch, and also by difference in the load capacitance.

Therefore, a stable high speed operation cannot be realized in an SRAM incorporating an internal clock generation circuit with such a phase comparator.

SUMMARY OF THE INVENTION

In view of the foregoing, an object of the present invention is to provide a synchronous semiconductor memory device that incorporates an internal clock signal generation circuit that can achieve phase synchronization at high precision.

A synchronous semiconductor memory device according to an aspect of the present invention receives an external signal including a control signal, an address signal, and an input signal in synchronization with an external clock signal. The synchronous semiconductor memory device includes a memory cell array having a plurality of memory cells arranged in a matrix in row and column directions, an internal clock signal generation circuit for providing an internal clock signal that is in phase-synchronization with an external clock signal, and a data input/output circuit for selecting a memory cell and carrying out data writing and reading with respect to the selected memory cell in synchronization with an internal clock signal. The internal clock signal generation circuit includes a delay line for delaying an external clock signal and providing an internal clock signal, a phase difference detection circuit for detecting phase difference between an external clock signal and an internal clock signal, and a delay control circuit for adjusting the delay time of the delay line according to the detected result of the phase difference detection circuit. The phase difference detection circuit includes a first signal line through which an external signal is transmitted, a second signal line through which an internal clock signal is transmitted, a first capacitive load provided corresponding to the first signal line, a second capacitive load provided corresponding to the second signal line, a phase control circuit for altering the phase difference between the signals of the first and second signal lines by altering the amount of current flowing between the second signal line and the second capacitive load in response to the external clock signal, and by altering the amount of current flowing between the first signal line and the first capacitive load according to the internal clock signal, and a comparator circuit for comparing the level change timing of the signal of the first signal line and the level changing timing of the signal of the second signal line.

The present invention provides the main advantage that the phase comparison precision is improved by increasing the phase difference of signals of the two signal lines that transmit an external clock signal and an internal clock signal that become the object of phase comparison using a capacitive load in a circuit that generates an internal clock signal in phase-synchronization with an external clock signal. Since a desired internal clock signal can be generated, the synchronous semiconductor memory device can be operated at high speed.

According to another aspect of the present invention, a synchronous semiconductor memory device receives an external signal including a control signal, an address signal, and an input signal in synchronization with an external clock signal. The synchronous semiconductor memory device includes a memory cell array having a plurality of memory cells arranged in a matrix in row and column directions, an internal clock signal generation circuit for providing an internal clock signal in phase-synchronization with the external clock signal, and a data input/output circuit for selecting a memory cell and carrying out data writing and reading with respect to the selected memory cell in synchronization with the internal clock signal. The internal clock signal generation circuit includes a delay line for delaying the external clock signal for providing an internal clock signal, a phase difference detection circuit for detecting the phase difference between the external clock signal and the internal clock signal, and a delay control circuit for adjusting the delay time of the delay line according to the detected result of the phase difference detection circuit. The phase difference detection circuit includes a first power supply potential provided corresponding to the external clock signal, a second power supply potential provided corresponding to the internal clock signal, and a signal detection circuit for detecting the arriving rate of the external and internal clock signals for providing a signal according to the first or second power supply potential as the detected result.

The present invention provides the further main advantage that the phase can be compared at high precision by detecting the arriving rate of an external clock signal and an internal clock signal that are the objects of phase comparison and providing an output which is the detected result converted into a potential in a circuit for generating an internal clock signal in phase-synchronization with an external clock signal. Therefore, a desired internal clock signal can be generated. Thus, a synchronous semiconductor memory device can be operated at high speed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4B are timing charts showing an example of transition of signals (ECLK and RCLK) received by a phase control unit 12.

FIGS. 5A–5B are timing charts for describing an operation of phase control unit 12 with respect to the two clock signals shown in FIGS. 3A and 4B.

FIGS. 6A–6B are timing charts showing another example of transition of signals (ECLK and RCLK) received by phase control unit 12.

FIGS. 7A–7B are timing charts for describing an operation of phase control unit 12 with respect to the two clock signals of FIGS. 6A and 6B.

DESCRIPTION OF THE PREFERRED EMBODIMENTS

First Embodiment

A SDRAM according to a first embodiment of the present invention will be described hereinafter.

First, the entire structure of a SDRAM 1000 of the first embodiment will be described with reference to FIG. 1.

Figure 1:
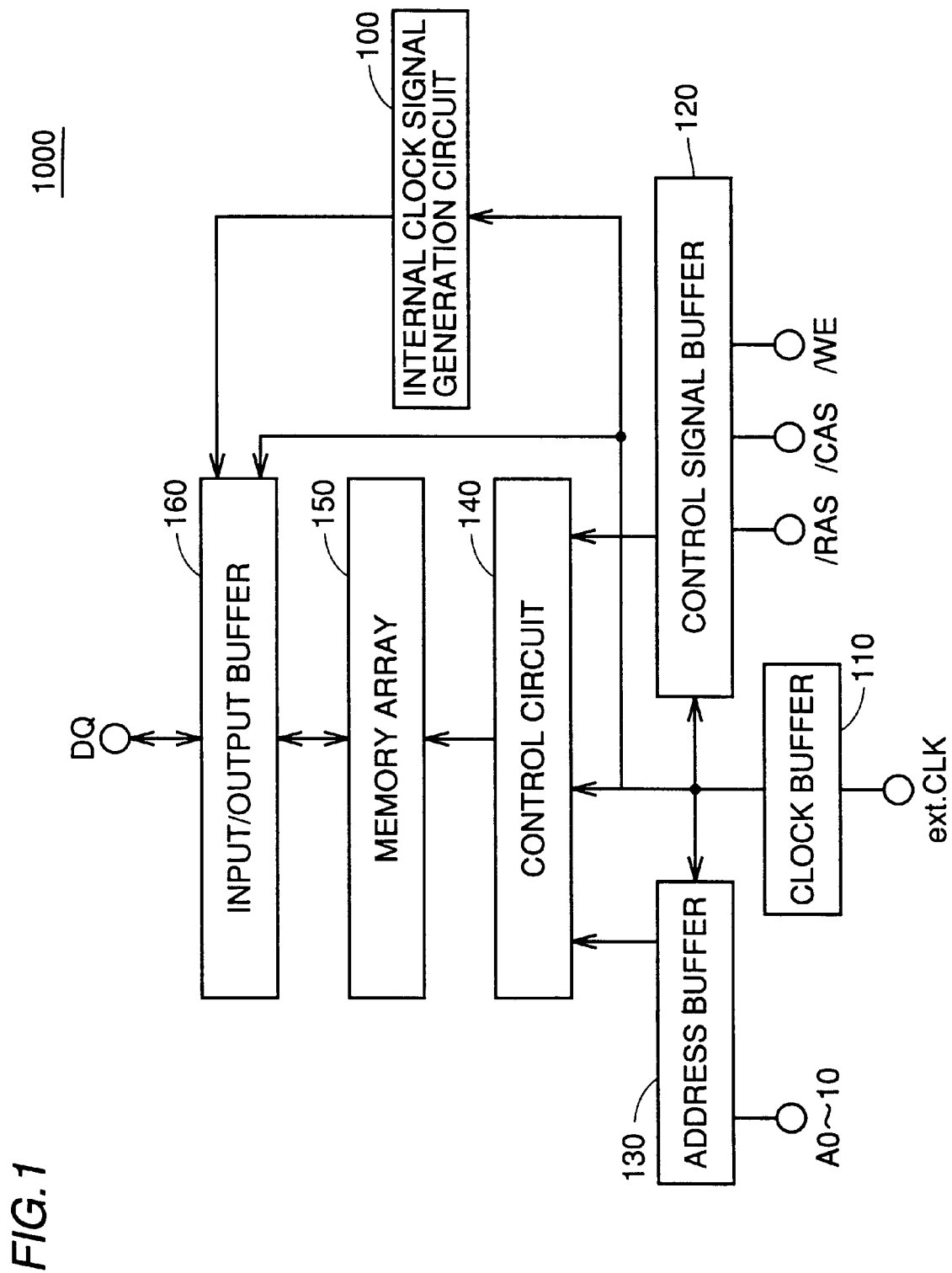
FIG. 1 is a schematic block diagram showing an example of an entire structure of a SDRAM 1000 according to a first embodiment of the present invention.

Referring to FIG. 1, SDRAM 1000 includes a clock buffer 110, a control signal buffer 120, an address buffer 130, a control circuit 140, a memory array 150, an input/output buffer 160, and an internal clock signal generation circuit 100.

Memory array 150 includes a plurality of memory cells not shown connected in a matrix in the row and column directions. Clock buffer 110 receives an external clock signal ext.CLK to output a clock signal. Control signal buffer 120 receives an external control signal (row address strobe signal /RAS, column address strobe signal /CAS, a write enable signal /WE and the like) for driving control circuit 140. Address buffer 130 receives an address signal Add specifying a memory cell to be selected from address pins A0–A10. Control circuit 140 renders a memory cell to a selected state in synchronization with a clock signal output from clock buffer 110.

Internal clock signal generation circuit 100 provides an internal clock signal in phase-synchronization with the clock signal output from clock buffer 110. A DLL circuit or a PLL circuit is used as internal clock signal generation circuit 100.

Input/output buffer 160 responds to this internal clock signal to receive data to be written into a selected memory cell or to output the data read out from a selected memory cell via data an input/output terminal DQ. For example, SDRAM 1000 inputs/outputs byte data of 8 bits via data input/output terminal DQ.

An example of a structure of internal clock signal generation circuit 100 incorporated in SDRAM 1000 will be described hereinafter with reference to the block diagram of FIG. 2.

Figure 14:
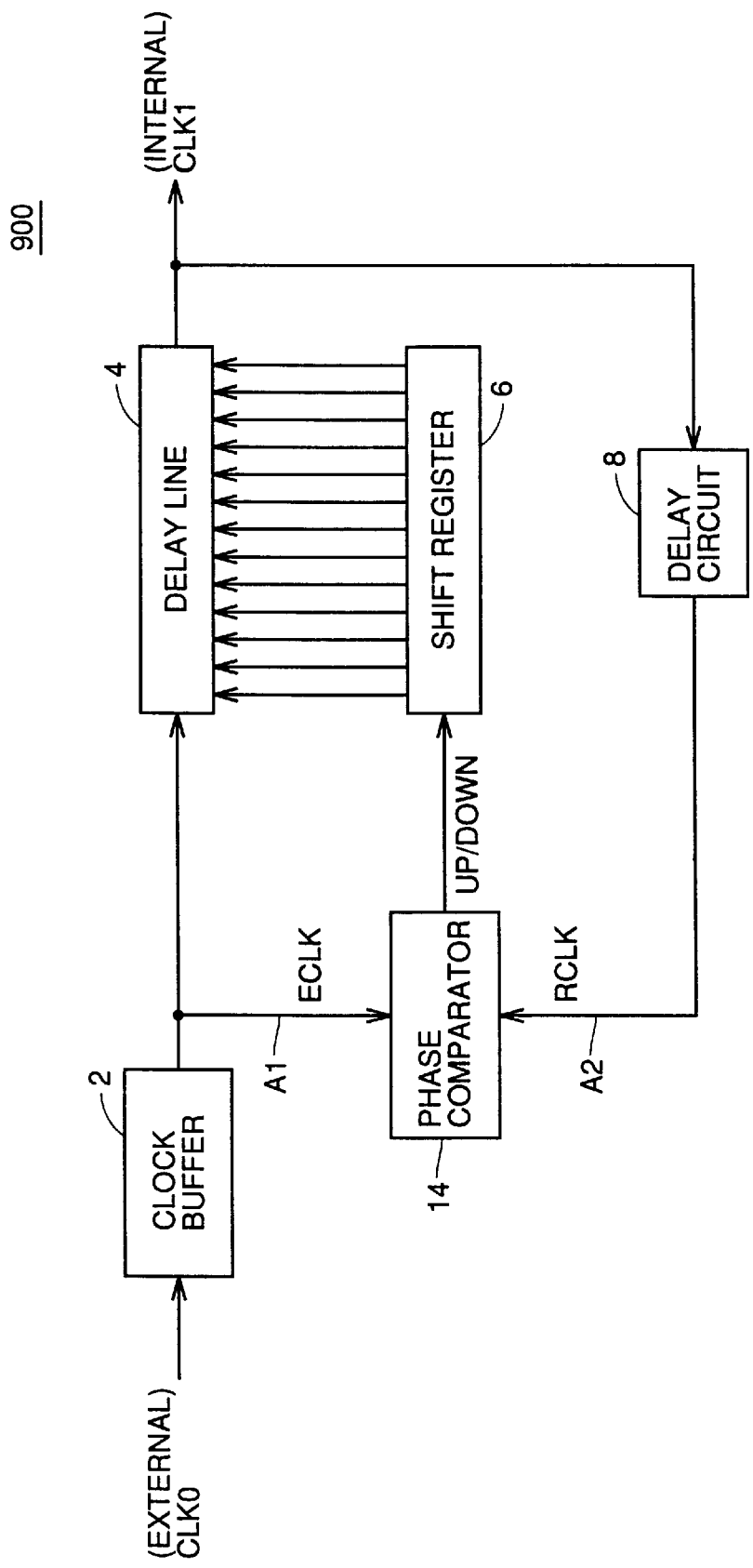
FIG. 14 is a schematic block diagram showing a basic structure of a conventional DLL circuit 900.

Components corresponding to those in the conventional internal clock signal generation circuit 900 shown in FIG. 14 have the same reference character allotted thereto. Their description will not be repeated here.

Figure 2:
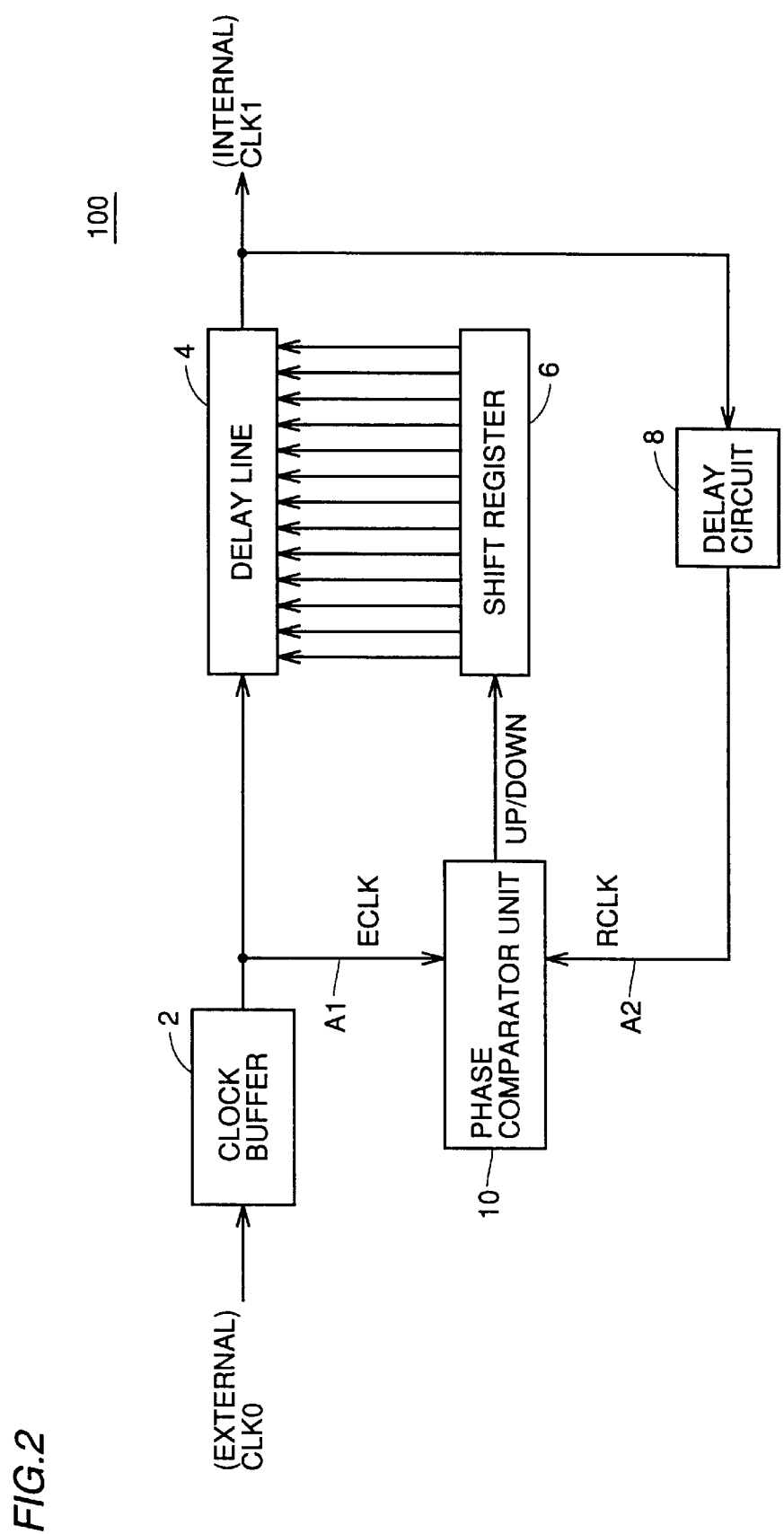
FIG. 2 is a schematic block diagram showing an example of a specific structure of an internal clock signal generation circuit 100 according to the first embodiment of the present invention.

Internal clock signal generation circuit 100 shown in FIG. 2 forms a DLL circuit, and includes a clock buffer 2, a delay line 4, a shift register 6, a phase comparator unit 10 and a delay circuit 8.

Internal clock signal generation circuit 100 of FIG. 2 receives an externally applied clock signal (referred to as external clock signal CLK0 hereinafter) to provide a clock signal in phase-synchronization (referred to as internal clock signal CLK1 hereinafter).

Phase comparator unit 10 receives a clock signal ECLK corresponding to external clock signal CLK0 from clock buffer 2 via signal line A1. Phase comparator unit 10 receives a clock signal RCLK corresponding to an internal clock signal CLK1 from delay circuit 8 via signal line A2. Phase comparator unit 10 enlarges the phase difference of these signals and then compares the phases. A signal UP/DOWN is output as the result of this phase comparison. Shift register 6 responds to signal UP/DOWN from phase comparator unit 10 to adjust the delay time of delay line 4.

An example of a structure of phase comparator unit 10 according to the first embodiment of the present invention (refer to as phase comparator unit 10.1 hereinafter) will be described with reference to FIG. 3.

Figure 3:
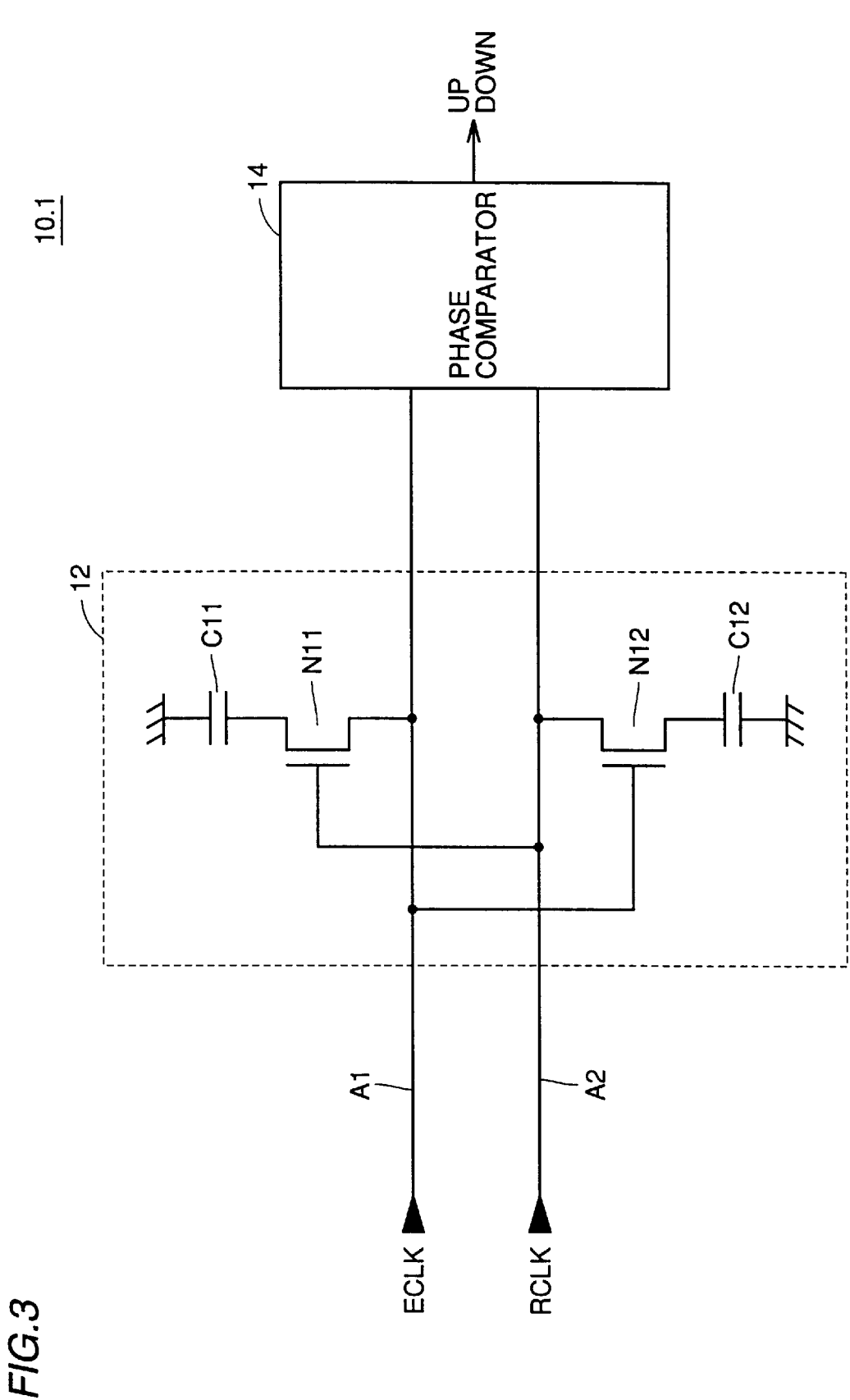
FIG. 3 shows an example of a specific structure of a phase comparator unit according to the first embodiment of the present invention.

Phase comparator unit 10.1 of FIG. 3 includes a phase control unit 12 and a phase comparator 14. Phase control unit 12 enlarges the phase difference of the signals transmitted via signal lines A1 and A2. Phase comparator 14 detects the difference in the rising timing of the signals received from signal lines A1 and A2 to provide signals UP/DOWN as the detected result.

A specific structure of phase control unit 12 of the first embodiment will be described hereinafter.

As shown in FIG. 3, phase control unit 12 includes capacitors C11 and C12, and MOS transistors N11 and N12.

MOS transistor N11 is connected between signal line A1 and one terminal of capacitor C11. Capacitor C11 has its other terminal connected to ground potential GND. MOS transistor N11 has its gate electrode connected to signal line A2.

MOS transistor N12 is connected between signal line A2 and one terminal of capacitor C12. The other terminal of capacitor C12 is connected to ground potential GND. MOS transistor N12 has its gate electrode connected to signal line A1.

In the first embodiment, MOS transistors N11 and N12 are both N channel MOS transistors.

MOS transistor N11 is a switching element for controlling the amount of current flowing from signal line A1 to capacitor C11 according to clock signal RCLK. MOS transistor N12 is a switching element for controlling the amount of current flowing from signal line A2 to capacitor C12 according to clock signal ECLK.

More specifically, when clock signal RCLK is at an H level, capacitor C11 is electrically connected to signal line A1, whereby current flows from signal line A1 to capacitor C11. When clock signal ECLK is at an H level, capacitor C12 is electrically connected to signal line N2, whereby current flows from signal line A2 to capacitor C12.

The operation of phase control unit 12 of the first embodiment will be described hereinafter with reference to the timing charts of FIGS. 4A to 7B.

FIGS. 4A and 5A show the transition of clock signal ECLK. FIGS. 4B and 5B show the transition of clock signal RCLK. FIGS. 6A and 7A show the transition of clock signal ECLK. FIGS. 6B and 7B show the transition of clock signal RCLK.

First, the case where the phase of clock signal RCLK is ahead of the phase of clock signal ECLK will be described with reference to FIGS. 4A, 4B, 5A and 5B. In this case, the difference in the rising timing between clock signal RCLK and clock signal ECLK is t1 as shown in FIGS. 4A and 4B.

MOS transistors N11 and N12 are initially in a nonconductive state. When phase control unit 12 receives an associated clock signal shown in FIGS. 4A–4B, MOS transistor N11 receives clock signal RCLK of an H level to be rendered conductive. As a result, signal line A1 and capacitor C11 are electrically connected. In response, the rising timing of clock signal ECLK transmitted through signal line A1 becomes more gentle as shown in FIGS. 5A and 5B. The phase difference (the difference in the rising timing) between clock signals RCLK and ECLK becomes t2 (>t1).

The case where the phase of clock signal RCLK is behind clock signal ECLK will be described hereinafter with reference to FIGS. 6A, 6B, 7A and 7B. As shown in FIGS. 6A and 6B, the phase difference (the difference in the rising timing) between clock signals ECLK and RCLK is t3.

First, MOS transistors N11 and N12 are both nonconductive. When phase control unit 12 receives an associated clock signal shown in FIGS. 6A and 6B, MOS transistor N12 receives clock signal ECLK of an H level to conduct. As a result, signal line A2 and capacitor C12 are electrically connected. Thus, the rising timing of clock signal RCLK transmitted through signal line A2 becomes more gentle. The phase difference (the difference in rising timing) between clock signals ECLK and RCLK becomes t4 (>t3).

More specifically, the rising timing of the signal that is lagging in phase out of the signals of signal lines A1 and A2 becomes more gentle by phase comparator 12. As a result, the phase difference between the signals that are the objects of comparison is increased in phase comparator 14. Therefore, the phase can be compared at high precision.

Thus, internal clock signal generation circuit 100 can generate an internal clock signal in phase-synchronization at high precision.

Another example of a phase comparator unit (referred to as phase comparator unit 10.2 hereinafter) of internal clock signal generation circuit 100 will be described hereinafter with reference to the circuit diagram of FIG. 8. Components corresponding to those of phase comparator unit 10.1 of FIG. 3 have a same reference characters allotted, and their description will not be repeated.

Figure 8:
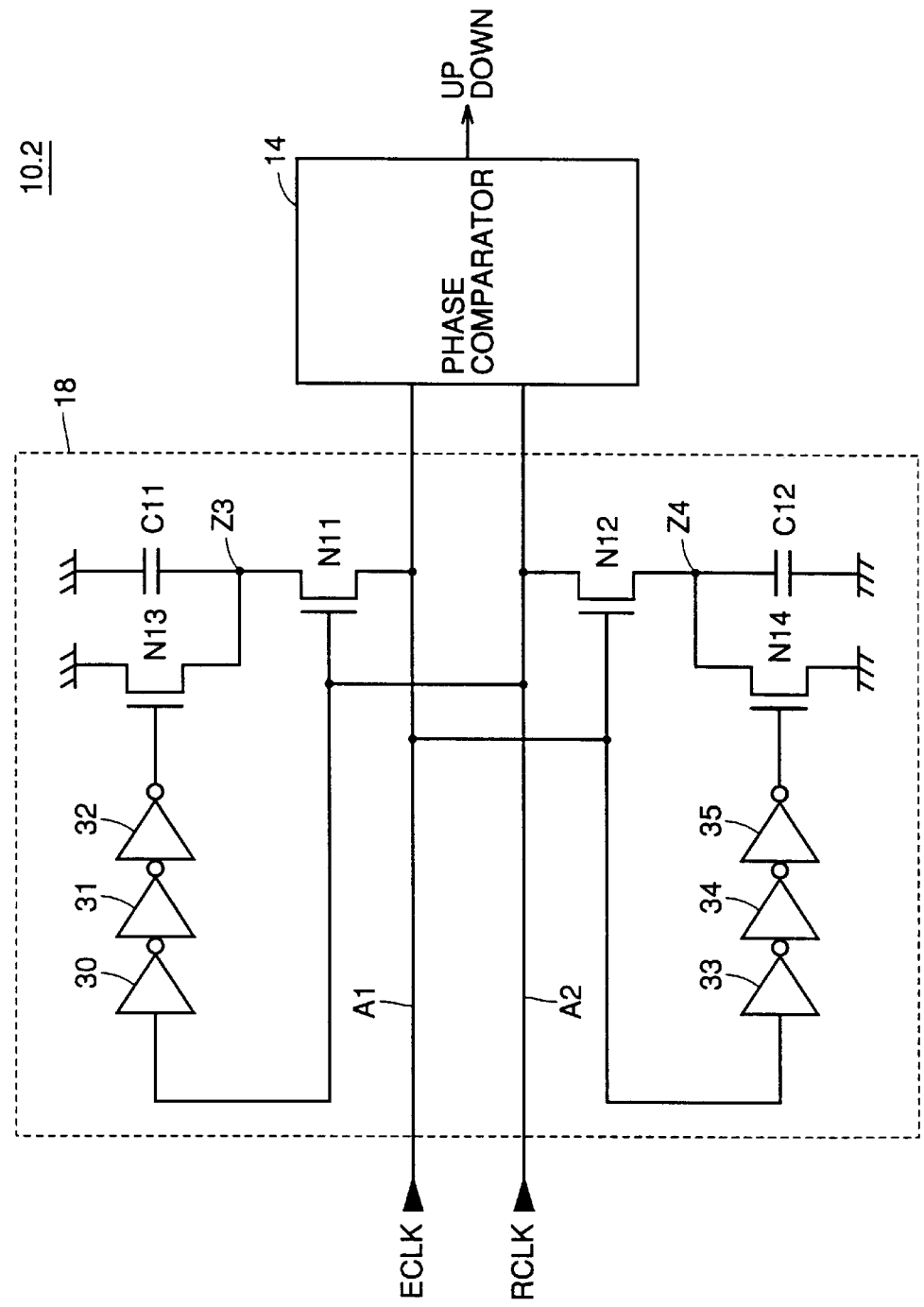
FIG. 8 shows an example of another specific structure of a phase comparator unit in internal clock signal generation circuit 100 of the first embodiment.

Referring to FIG. 8, phase comparator unit 10.2 includes a phase control unit 18 and a phase comparator 14. Phase control unit 18 enlarges the phase difference of respective signals of signal lines A1 and A2. Phase comparator 14 detects the difference in the rise timing of the signal received from signal lines A1 and A2 to provide signal UP/DOWN as the detected result.

The structure of phase control unit 18 according to the first embodiment of the present invention will be described specifically hereinafter.

As shown in FIG. 8, phase control unit 18 includes capacitors C11 and C12, MOS transistors N11, N12, N13 and N14, and inverter circuits 30, 31, 32, 33, 34 and 35.

The connection relationship of MOS transistors N11 and N12 and capacitors C11 and C12 is as described with reference to FIG. 3.

MOS transistor N13 is connected between a node Z3 which is the connection node of MOS transistor N11 and capacitor C11, and ground potential GND. Inverter circuits 30, 31 and 32 are connected in series between signal line A2 and the gate electrode of MOS transistor N13.

MOS transistor N14 is connected between a node Z4 which is the connection node of MOS transistor N12 and capacitor C12, and ground potential GND. Inverter circuits 33, 34 and 35 are connected in series between signal line A1 and the gate electrode of MOS transistor N14.

In the first embodiment, MOS transistors N13 and N14 are both N channel MOS transistors.

An operation of phase control unit 18 according to the first embodiment of the present invention will be described hereinafter.

MOS transistor N13 is rendered conductive when the signal of signal line A2 (clock signal RCLK) is pulled down to an L level. This conduction of MOS transistor N13 causes the charge stored in capacitor C11 to be discharged.

MOS transistor N14 is rendered conductive when the signal of signal line A1 (clock signal ECLK) is pulled down to an L level. The conduction of MOS transistor N14 causes the charge stored in capacitor C12 to be discharged.

Since the charge stored in corresponding capacitors C11 and C12 can be discharged according to the falling timing of the respective signals of signal lines A1 and A2 by phase control unit 18, phase comparison can be carried out successively in phase comparator 14. The rising timing of the signal having a more lagging phase out of the signals of signal lines A1 and A2 becomes more gentle. Therefore, the phase comparison by phase comparator 14 can be carried out at higher precision.

Thus, internal clock signal generation circuit 100 can generate an internal clock signal in phase-synchronization at high precision.

Figure 15:
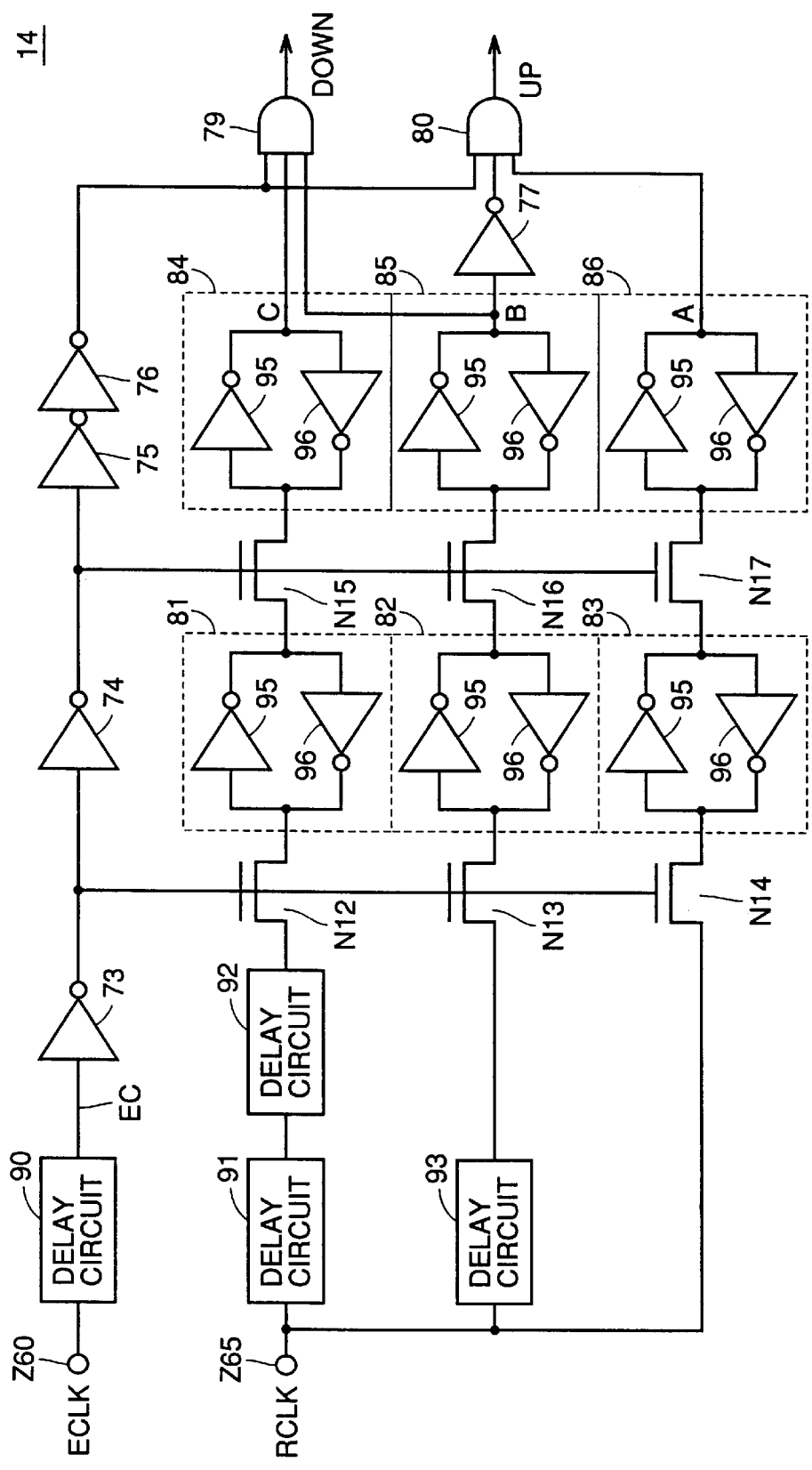
FIG. 15 is a circuit diagram showing example of a specific structure of a conventional phase comparator 14.

More specifically, phase comparator unit 10 of the first embodiment shown in FIGS. 3 and 8 can determine the phase difference of approximately ¼ the determination limit of the conventional phase comparator 14 shown in FIG. 15. This means that, in contrast to the determination accuracy of the phase difference of 1 ns by the conventional phase comparator 14, phase comparator unit 10 of the first embodiment of the present invention can determine the phase difference up to the precision of approximately 0.25 ns.

As a result, high speed operation can be realized by using internal clock signal generation circuit 100 including the above-described phase comparator unit 10 in SDRAM 1000 shown in FIG. 1.

The present invention is not limited to the above specific structure. For example, the capacitor can be formed of an MOS capacitor.

Also, the present invention is not limited to a DLL circuit, and is applicable to a PLL circuit.

Second Embodiment

A structure of an internal clock signal generation circuit according to a second embodiment of the present invention will be described hereinafter with reference to the block diagram of FIG. 9.

An internal clock signal generation circuit 200 according to the second embodiment of the present invention differs from internal clock signal generation circuit 100 of FIG. 2 in that a phase comparator unit 20 is substituted for phase comparator unit 10.

Phase comparator unit 20 receives a clock signal ECLK corresponding to external clock signal CLK0 from clock buffer 2 via signal line A1. Phase comparator unit 20 also receives clock signal RCLK corresponding to internal clock signal CLK1 output from delay circuit 8 via signal line A2. Phase comparator unit 20 compares the phases by detecting the arriving rate of these signals. Shift register 6 adjusts the delay time of delay line 4 according to the output of phase comparator unit 20.

An example of a structure of a phase comparator unit 20.1 hereinafter will be described with reference to FIG. 10.

Figure 10:
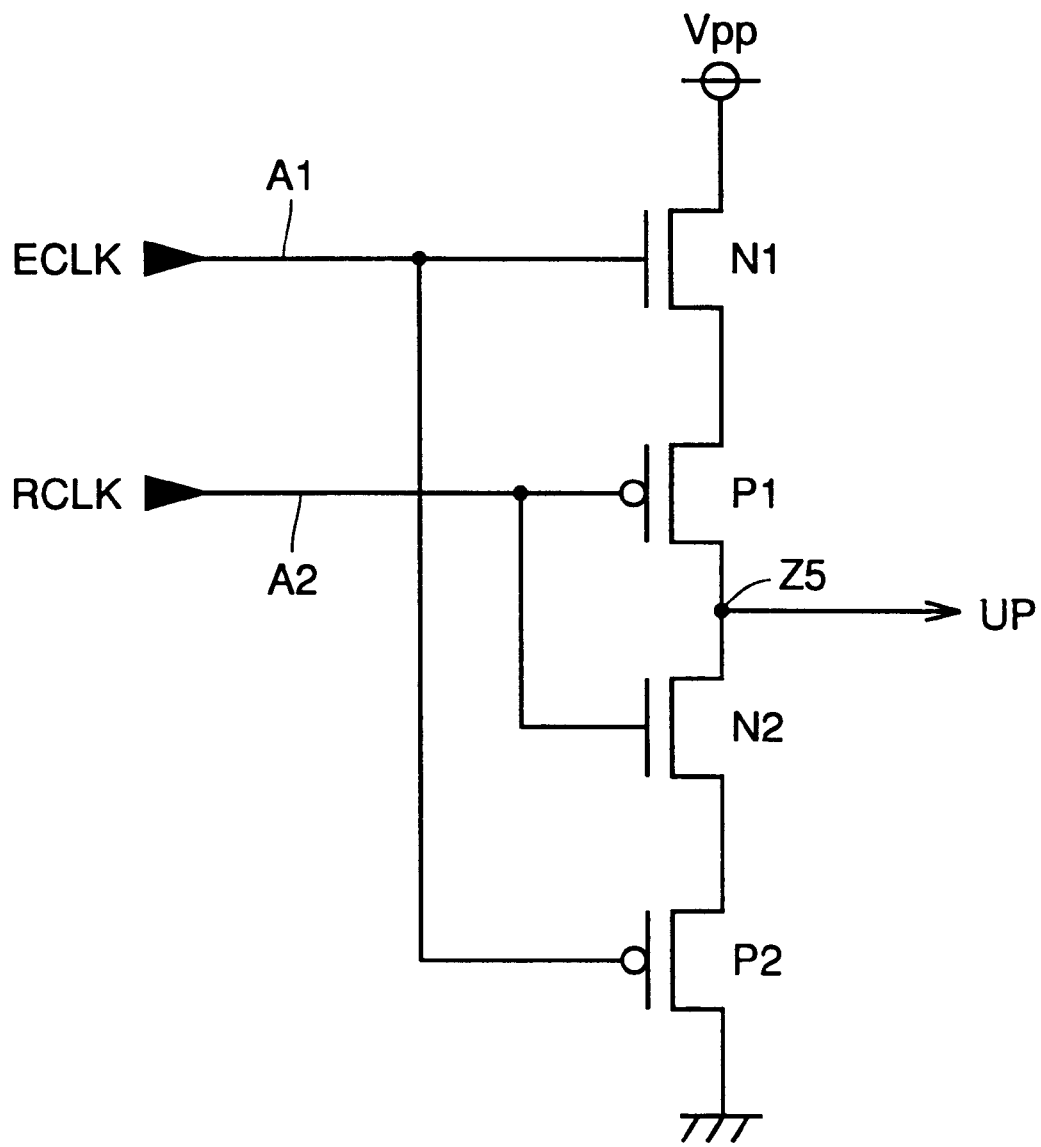
FIGS. 10–12 are circuit diagrams showing specific examples of a phase comparator unit according to the second embodiment of the present invention.

Referring to FIG. 10, phase comparator 20.1 includes MOS transistors N1, N2, P1 and P2.

MOS transistors N1 and N2 are N channel MOS transistors. MOS transistors P1 and P2 are P channel MOS transistors.

MOS transistor N1 is connected between an internal boosted power supply Vpp and one conduction terminal of MOS transistor P1. MOS transistor P1 has the other conduction terminal connected to one conduction terminal of MOS transistor N2. MOS transistor P2 is connected to the other conduction terminal of MOS transistor N2 and ground potential GND.

MOS transistors N1 and P2 have their gate electrodes connected to signal line A1. MOS transistors N2 and P1 have their gate electrodes connected to signal line A2.

Figure 9:
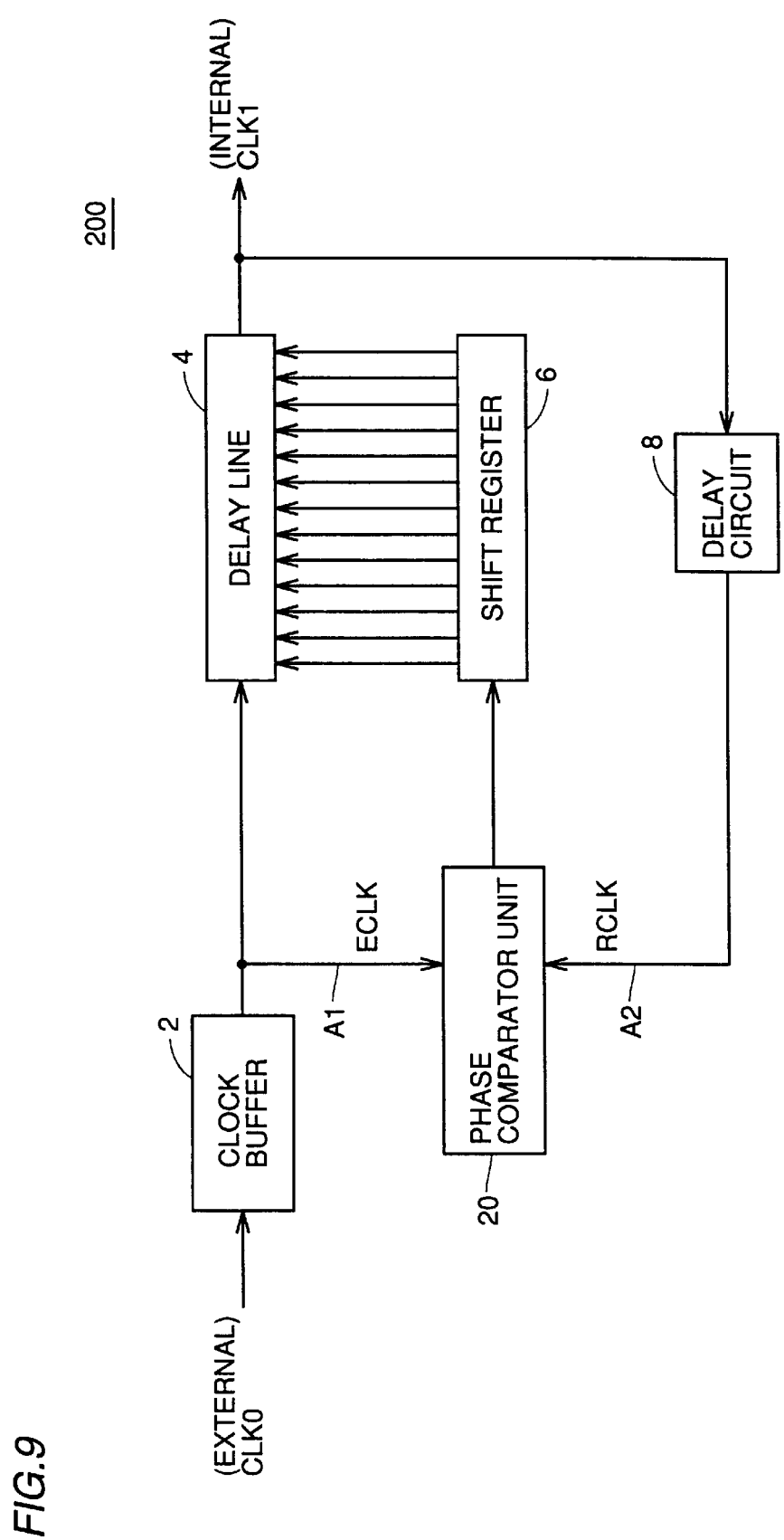
FIG. 9 is a block diagram showing an example of a specific structure of an internal clock signal generation circuit 200 according to a second embodiment of the present invention.

As described before, clock signal ECLK output from clock buffer 2 shown in FIG. 9 is transmitted through signal line A1. Clock signal RCLK output from delay circuit 8 shown in FIG. 9 is transmitted through signal line A2.

A transistor of the same size (for example, W=10 $\mu$m, L=0.35 $\mu$m) is used for MOS transistors P1 and P2. Also, a transistor of the same size (for example, W=5 $\mu$m, L=0.35 $\mu$m) is used for MOS transistors N1 and N2.

An operation of phase comaprator unit 21.1 according to the second embodiment of the present invention will be described hereinafter.

The case where the phase of clock signal RCLK is ahead of the phase of clock signal ECLK will be described. In this invent, MOS transistors N2 and P2 are both rendered conductive, and MOS transistors N1 and P1 are both rendered non-conductive.

Accordingly, a signal of an L level (signal UP) is output from node Z5 which is the connection node of MOS transistor P1 and MOS transistor N2.

When the phase of clock signal RCLK is behind the phase of clock signal ECLK, MOS transistors N1 and P1 are both rendered conductive, and MOS transistors N2 and P2 are both rendered non-conductive.

Accordingly, a signal UP of an H level is provided from node Z5.

Shift register 6 of FIG. 9 provides control so that the delay time of delay line 4 is shortened and lengthened when the output signal of phase comparator unit 20.1 attains an H level and an L level, respectively.

More respectively, phase comparator unit 20.1 responds to the transmission speed of respective signals of signal lines A1 and A2 to provide a signal of an H or L level.

By implementing phase comparator unit 20.1 as described above, the load capacitance of the circuit through which clock signal ECLK passes can be made equal to that of the circuit through which clock signal RCLK passes. Thus, phase comparison at high precision is possible.

Another specific example of phase comparator unit 20 (referred to as phase comparator unit 20.2 hereinafter) will be described hereinafter with reference to FIG. 11. Components corresponding to those of phase comparator unit 20.1 of FIG. 10 have the same reference characters allotted, and their description will not be repeated.

Figure 11:
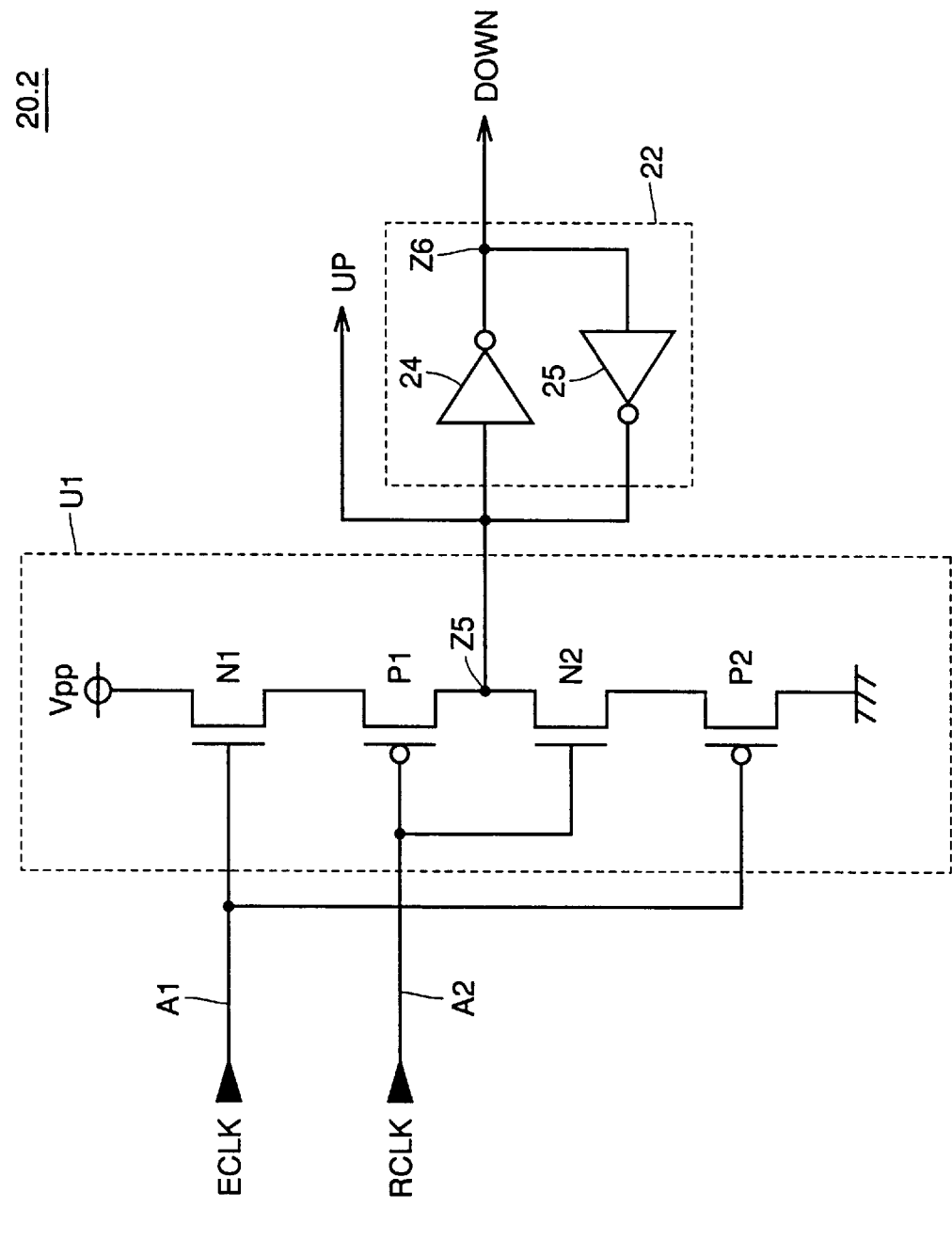

Referring to FIG. 11, phase comparator unit 20.2 includes a unit U1 and a latch circuit 22.

Unit U1 includes MOS transistors N1, N2, P1 and P2.

The connection relationship of MOS transistors N1, N2, P1 and P2 in unit Ul is as described with reference to FIG. 10.

Latch circuit 22 includes inverter circuits 24 and 25. The input node of inverter circuit 24 and the output node of inverter circuit 25 are connected to node Z5 which is the connection node of MOS transistor P1 and MOS transistor N2. Inverter circuit 25 has its input node connected to the output node of inverter circuit 24.

Phase comparator unit 20.2 provides signal UP from node Z5. Inverter circuit 24 provides signal DOWN from its output node Z6 (the input node of inverter circuit 25).

An operation the phase comparator unit 20.2 according to the second embodiment of the present invention will be described hereinafter.

When the phase of clock signal RCLK is ahead of the phase of clock signal ECLK, MOS transistors N2 and P2 are both rendered conductive, and MOS transistors N1 and P1 are both rendered non-conductive. Accordingly, signal UP of an L level is output from node Z5, and signal DOWN of an H level is output from node Z6.

When the phase of clock signal RCLK is behind the phase of clock signal ECLK, MOS transistors N1 and P1 are both rendered conductive, and MOS transistors N2 and P2 are both rendered non-conductive. Accordingly, signal UP of an H level is output from node Z5. Signal DOWN of an L level is output from node Z6.

The case where clock signals RCLK and ECLK both have the same level (H level or L level) will be described hereinafter.

When the signals are both at an H level in phase control unit 20.1 shown in FIG. 10, MOS transistors N1 and N2 are rendered conductive and MOS transistors P1 and P2 are both rendered nonconductive. When the signals are both at an L level, MOS transistors P1 and P2 are both rendered conductive and MOS transistors N1 and N2 are both rendered nonconductive. As a result, signal UP attains a Hi-Z (high impedance) state.

In phase control unit 20.2 shown in FIG. 11, signal UP/DOWN is output according to the signal held in latch circuit 22. This prevents signal UP/DOWN from attaining a Hi-Z state.

Although an inverter type latch circuit 22 was described in FIG. 11, a similar effect can be obtained using a latch circuit of another type such as a NAND type.

Another specific example of phase comparator unit 20 (referred to as a phase comparator unit 20.3 hereinafter) according to the second embodiment of the present invention will be described hereinafter with reference to FIG. 12.

Components corresponding to phase comparator 20.2 of FIG. 11 have the same reference characters allotted, and their description will not be repeated.

Figure 12:
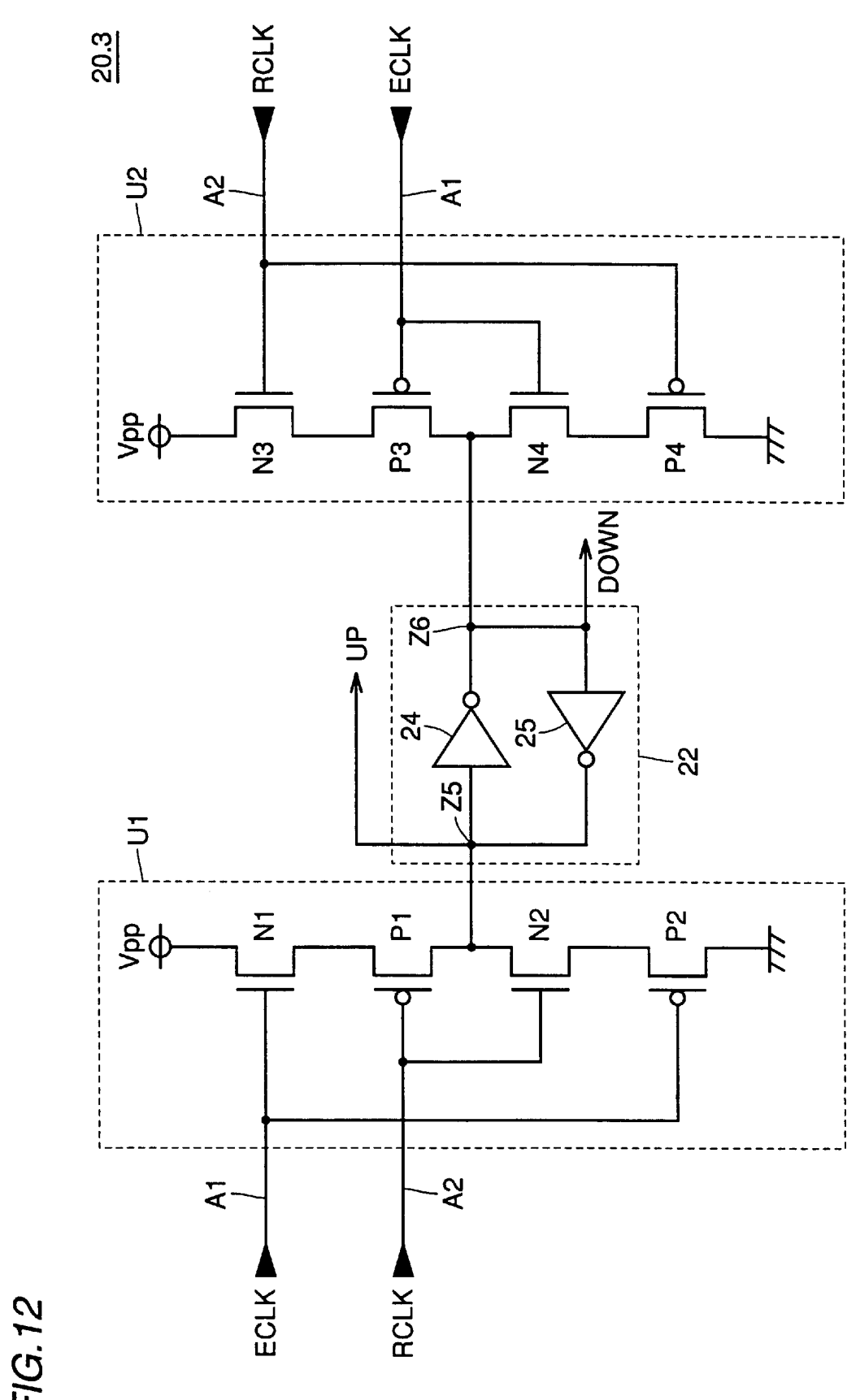
Figure 13:
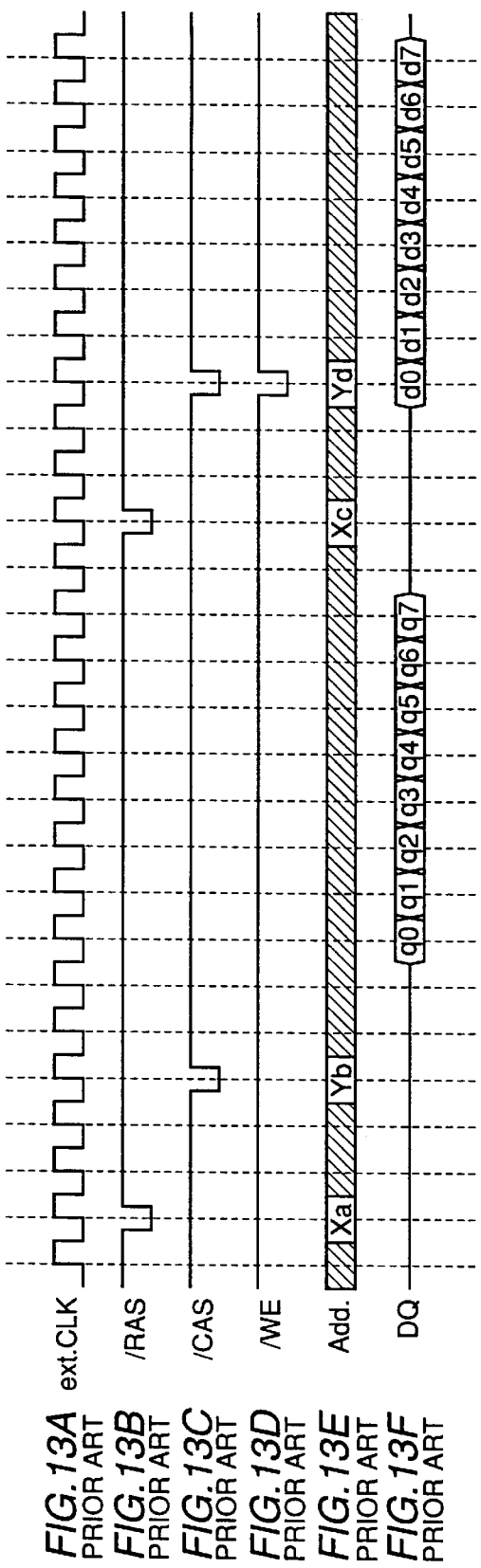
FIGS. 13A–13F are typical timing charts satisfying high speed access usage in a conventional SDRAM.

Referring to FIG. 12, phase comparator unit 20.3 includes units U1 and U2 and a latch circuit 22. Units U1 and U2 both detect the phase difference (the signal arriving rate) of the signal (ECLK) of signal line A1 and the signal (RCLK) of signal line A2.

Unit U1 includes MOS transistors N1, N2, P1 and P2. The connection relationship of MOS transistors N1, N2, P1 and P2 and latch circuit 22 is as described with reference to FIG. 11.

Unit U2 includes MOS transistors N3, N4, P3 and P4. MOS transistors N3 and N4 are N channel MOS transistors. MOS transistors P3 and P4 are P channel MOS transistors.

MOS transistor N3 and MOS transistor N4 are transistors of the same size. Also, MOS transistor P3 and MOS transistor P4 are transistors of the same size.

MOS transistor N3 is connected between internal boosting power supply Vpp and one conduction terminal of MOS transistor P3. MOS transistor P3 has its other conduction terminal connected to node Z6. MOS transistor P4 is connected between ground potential GND and one conduction terminal of MOS transistor N4. MOS transistor N4 has its other conduction terminal connected to node Z6.

MOS transistors N3 and P4 have respective gate electrodes connected to signal line A2. MOS transistors P3 and N4 have respective gate electrodes connected to signal line A1.

An operation of phase comparator unit 20.3 according to the second embodiment of the present invention will be described hereinafter.

When the phase of clock signal RCLK is ahead of the phase clock signal ECLK, MOS transistors N2 and P2 are both rendered conductive, and MOS transistors N1 and P1 are both rendered nonconductive. Also, MOS transistors N3 and P3 are both rendered conductive and MOS transistors N4 and P4 are both rendered nonconductive.

Accordingly, signal UP of an L level is output from node Z5, and signal DOWN of an H level is output from node Z6.

When the phase of clock signal RCLK is behind the phase of clock signal ECLK, MOS transistors N1 and P1 are rendered conductive and MOS transistors N2 and P2 are rendered nonconductive. Also, MOS transistors N4 and P4 are rendered conductive, and MOS transistors N3 and P3 are rendered nonconductive.

Accordingly, signal UP of an H level is output from node Z5, and signal DOWN of an L level is output from node Z6.

When clock signal RCLK and clock signal ECLK are both at the same level (H level or L level), signal UP/DOWN is output according to the signal held in latch circuit 22. Thus, signal UP/DOWN can be prevented from attaining a Hi-Z state.

Shift register 6 shown in FIG. 9 adjusts the delay time of delay line 4 in response to the output signal (signal UP/DOWN) of phase comparator unit 20.3.

By providing a structure in which unit U1 for detecting phase difference is connected to unit U2 having a structure identical to that of unit U1 provided that the sequence of the input signal is replaced with latch circuit 22 therebetween, the circuits through which clock signals ECLK and RCLK pass through can be set completely symmetric in phase comparator unit 20.3. As a result, the load capacitance of the circuit through which clock signal ELCK passes can be made equal to that of the circuit through which clock signal RCLK passes. Thus, phase comparison at a higher precision is allowed.

Thus, a high speed operation can be similarly realized by substituting internal clock signal generation circuit 100 with internal clock signal generation circuit 200 including phase comparator unit 20.1, 20.2 or 20.3 in SDRAM 1000.

According to the synchronous semiconductor memory device of the present invention, the phase of two signals can be compared at high precision by enlarging the phase difference of the signals of the two signal lines through which the external and internal clock signals that are the objects of phase comparison are transmitted using capacitive load in a circuit that generates an internal clock signal in phase-synchronization with an external clock signal. This improvement in the phase comparison precision allows generation of a desired internal clock signal. Therefore, a synchronous semiconductor memory device can be operated at high speed.

By drawing out charge stored in the capacitive load of the circuit that generates an internal clock signal in phase-synchronization with an external clock signal, phase comparison can be carried out continuously. Thus, a desired internal clock signal can be generated, and the synchronous semiconductor memory device can be operated at high speed.

According to the synchronous semiconductor memory device of the present invention, the phase can be compared by detecting the arriving rate of an external clock signal and an internal clock signal that are the objects of the phase comparison in a circuit that generates an internal clock signal in phase-synchronization with an external clock signal and converting the detected arriving rate into potential for output. Thus, a desired internal clock signal can be generated. A synchronous semiconductor memory device can be operated at high speed.

By forming the circuit of detecting the arriving rate by MOS transistors of the same size in the circuit for generating an internal clock signal in phase-synchronization with an external clock signal, the load capacitance of the circuits through which an external clock signal and an internal clock signal that are the objects of phase comparison pass through can be set equal. Thus, phase comparison of high precision can be implemented.

By providing a latch circuit in the circuit for generating an internal clock signal in phase-synchronization with an external clock signal, output of a signal of high impedance state can be prevented even when the arriving rate is not detected.

By providing a structure in which the above-described detection circuit is connected to the detection circuit having the same structure and the sequence of the input signal replaced with the latch circuit therebetween in the circuit for generating an internal clock signal in phase-synchronization with an external clock signal, the circuits through which external and internal clock signals pass through can be made completely symmetrical. As a result, the load capacitance becomes equal. Thus, the phase can be compared at higher precision.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving external signals including a control signal, an address signal, and an input signal in synchronization with an external clock signal, said synchronous semiconductor memory device comprising:

a memory cell array including a plurality of memory cells arranged in a matrix in row and column directions, internal clock signal generation means for providing an internal clock signal in phase-synchronization with said external clock signal, and data input/output means for selecting said memory cell and carrying out data writing and reading with respect to said selected memory cell in synchronization with said internal clock signal, said internal clock signal generation means including
      a delay line for delaying said external clock signal and providing said internal clock signal,
      phase difference detection means for detecting phase difference between said external clock signal and said internal clock signal, and
      delay control means for adjusting delay time of said delay line according to a detected result of said phase difference detection means, said phase difference detection means including
      a first signal line through which said external clock signal is transmitted,
      a second signal line through which said internal clock signal is transmitted,
      phase control means including a first capacitive load provided corresponding to said first signal line and a second capacitive load provided corresponding to said second signal line for altering phase difference between a signal of said first signal line and a signal of said second signal line by altering current flowing between said second signal line and said second capacitive load according to said external clock signal and altering current flowing between said first signal line and said first capacitive load according to said internal clock signal, and comparator means for comparing timing of level change of the signal of said first signal line and timing of level change of the signal of said second signal line.

2. The synchronous semiconductor memory device according to claim 1, said phase control means including
   first switching means provided corresponding to said first capacitive load, and responsive to the level change in said internal clock signal for adjusting the current flowing between said first signal line and said first capacitive load, and
   second switching means provided corresponding to said second capacitive load, and responsive to the level change in said external clock signal for adjusting the current flowing between said second signal line and said second capacitive load.

3. The synchronous semiconductor memory device according to claim 2,
   said first capacitive load being a first capacitor,
   said second capacitive load being a second capacitor,
   said first switching means being a first MOS transistor,
   said second switching means being a second MOS transistor,
   said first MOS transistor being connected between said first signal line and one terminal of said first capacitor, and having a gate electrode connected to said second signal line,
   said second MOS transistor being connected between said second signal line and one terminal of said second capacitor, and having a gate electrode connected to said first signal line,
   said first capacitor having another terminal connected to a power supply potential, and
   said second capacitor having another terminal connected to a power supply potential.

4. The synchronous semiconductor memory device according to claim 2,
   said first capacitive load being a first MOS transistor,
   said second capacitive load being a second MOS transistor,
   said first switching means being a first MOS transistor,
   said second switching means being a second MOS transistor,
   said first MOS transistor being connected between said first signal line and a conduction terminal of said first MOS transistor, and having a gate electrode connected to said second signal line,
   said second MOS transistor being connected between said second signal line and a conduction terminal of said second MOS transistor, and having a gate electrode connected to said first signal line,
   said first MOS transistor having the gate electrode connected to a power supply potential, and
   said second MOS transistor having the gate electrode connected to a power supply potential.

5. The synchronous semiconductor memory device according to claim 1, said phase control means including
   first switching means provided corresponding to said first capacitive load, and responsive to the level change in said internal clock signal for adjusting the current flowing between said first signal line (A1) and said first capacitive load (C11), second switching means provided corresponding to said second capacitive load, and responsive to the level change in said external clock signal for adjusting the current flowing between said second signal line and said second capacitive load, third switching means provided corresponding to said first capacitive load for discharging charge stored in said first capacitive load, and fourth switching means provided corresponding to said second capacitive load for discharging charge stored in said second capacitive load.

6. The synchronous semiconductor memory device according to claim 5, said first capacitive load being a first capacitor, said second capacitive load being a second capacitor, said first switching means being a first MOS transistor, said second switching means being a second MOS transistor, said third switching means being a third MOS transistor, said fourth switching means being a fourth MOS transistor, said first MOS transistor being connected between said first signal line and one terminal of said first capacitor, and having a gate electrode connected to said second signal line, said second MOS transistor being connected between said second signal line and one terminal of said second capacitor, and having a gate electrode connected to said first signal line, said third MOS transistor being connected between a connection node of said first capacitive load and said first MOS transistor, and a power supply potential, and having a gate electrode receiving a signal which is an inverted version of a signal of said second signal line, said fourth MOS transistor being connected between a connection node of said second capacitive load and said second MOS transistor, and a power supply potential, and having a gate electrode receiving a signal which is an inverted version of a signal of said first signal line, said first capacitor having another terminal connected to a power supply potential, and said second capacitor having another terminal connected to a power supply potential.

7. The synchronous semiconductor memory device according to claim 5, said first capacitive load being a first MOS transistor, said second capacitive load being a second MOS transistor, said first switching means being a first MOS transistor, said second switching means being a second MOS transistor, said third switching means being a third MOS transistor, p1 said fourth switching means being a fourth MOS transistor, said first MOS transistor being connected between said first signal line and a conduction terminal of said first MOS transistor, and having a gate electrode connected to said second signal line, said second MOS transistor being connected between said second signal line and a conduction terminal of said second MOS transistor, and having a gate electrode connected to said first signal line, said third MOS transistor being connected between a connection node of said first capacitive load and said first MOS transistor, and a power supply potential, and having a gate electrode receiving a signal which is an inverted version of a signal of said second signal line, said fourth MOS transistor being connected between a connection node of said second capacitive load and said second MOS transistor, and a power supply potential, and having a gate electrode receiving a signal which is an inverted version of a signal of said first signal line, said first MOS transistor having the gate electrode connected to a power supply potential, and the second MOS transistor having the gate electrode connected to a power supply potential.

8. A synchronous semiconductor memory device receiving external signals including a control signal, an address signal, and an input signal in synchronization with an external clock signal, said synchronous semiconductor memory device comprising:

a memory cell array including a plurality of memory cells arranged in a matrix in row and column directions, internal clock signal generation means for providing an internal clock signal in phase-synchronization with said external clock signal, and data input/output means for selecting said memory cell and carrying out data writing and reading with respect to said selected memory cell in synchronization with said internal clock signal, said internal clock signal generation means including a delay line for delaying said external clock signal and providing said internal clock signal, phase difference detection means for detecting phase difference between said external clock signal and said internal clock signal, and delay control means for adjusting delay time of said delay line according to a detected result of said phase difference detection means, said phase difference detection means including a source of a first power supply potential provided corresponding to said external clock signal, a source of a second power supply potential provided corresponding to said internal clock signal, and signal detection means for detecting arriving rate of said external clock signal and said internal clock signal for providing a signal according to said first power supply potential or said second power supply potential as a detected result.

9. The synchronous semiconductor memory device according to claim 8, said signal detection means including a first N channel MOS transistor having one conduction terminal connected to said first power supply potential, and having a gate electrode receiving said external clock signal, a first P channel MOS transistor having one conduction terminal connected to another conduction terminal of said first N channel MOS transistor, and having a gate electrode receiving said internal clock signal, a second P channel MOS transistor having one conduction terminal connected to said second power supply potential, and having a gate electrode receiving said external clock signal, and a second N channel MOS transistor connected between said first P channel MOS transistor and said second P channel MOS transistor, and having a gate electrode receiving said internal clock signal, a signal which is said detected result being output from a connection node of said first P channel MOS transistor and said second N channel MOS transistor.

10. The synchronous semiconductor memory device according to claim 9, said first N channel MOS transistor and said second N channel MOS transistor having the same size, and said first P channel MOS transistor and said second P channel MOS transistor having the same size.

11. The synchronous semiconductor memory device according to claim 8, said signal detection means including a first N channel MOS transistor having one conduction terminal connected to said first power supply potential, and having a gate electrode receiving said external clock signal, a first P channel MOS transistor having one conduction terminal connected to another conduction terminal of said first N channel MOS transistor, and having a gate electrode receiving said internal clock signal, a second P channel MOS transistor having one conduction terminal connected to said second power supply potential, and having a gate electrode receiving said external clock signal, a second N channel MOS transistor connected between said first P channel MOS transistor and said second P channel MOS transistor, and having a gate electrode receiving said internal clock signal, and latch means for latching potential of a connection node of said first P channel MOS transistor and said second N channel MOS transistor, a signal which is said detected result being output from said latch means.

12. The synchronous semiconductor memory device according to claim 11, said first N channel MOS transistor and said second N channel MOS transistor having the same size, and said first P channel MOS transistor and said second P channel MOS transistor having the same size.

13. The synchronous semiconductor memory device according to claim 8, said signal detection means including first detection means second detection means, and latch means provided between said first detection means and said second detection means, said first detection means including a first N channel MOS transistor having one conduction terminal connected to said first power supply potential, and having a gate electrode receiving said external clock signal, a first P channel MOS transistor having one conduction terminal connected to another conduction terminal of said first N channel MOS transistor, and having a gate electrode receiving said internal clock signal, a second P channel MOS transistor having one conduction terminal connected to said second power supply potential, and having a gate electrode receiving said external clock signal, and a second N channel MOS transistor connected between said first P channel MOS transistor and said second P channel MOS transistor, and having a gate electrode receiving said internal clock signal, said second detection means including a third N channel MOS transistor having one conduction terminal connected to said first power supply potential, and having a gate electrode receiving said internal clock signal, a third P channel MOS transistor having one conduction terminal connected to another conduction terminal of said third N channel MOS transistor, and having a gate electrode receiving said external clock signal, a fourth P channel MOS transistor having one conduction terminal connected to said second power supply potential, and having a gate electrode receiving said internal clock signal, and a fourth N channel MOS transistor connected between said fourth P channel MOS transistor and said third P channel MOS transistor, and having a gate electrode receiving said external clock signal, said latch means including a first inverter circuit, and a second inverter circuit, an input node of said first inverter circuit and an output node of said second inverter circuit being connected to a connection node of said first P channel MOS transistor and said second N channel MOS transistor, an output node of said first inverter circuit and an input node of said second inverter circuit being connected to a connection node of said third P channel MOS transistor and said fourth N channel MOS transistor, a signal which is said detected result being output from said first and second inverter circuits.

14. The synchronous semiconductor memory device according to claim 13, said first N channel MOS transistor and said second N channel MOS transistor having the same size, said third N channel MOS transistor and said fourth N channel MOS transistor having the same size, said first P channel MOS transistor and said second P channel MOS transistor having the same size, and said third P channel MOS transistor and said fourth P channel MOS transistor having the same size.

* * * * *